United States Patent
Kang et al.

(10) Patent No.: US 9,118,000 B2
(45) Date of Patent: Aug. 25, 2015

(54) METHOD OF MANUFACTURING FLEXIBLE PIEZOELECTRIC ENERGY HARVESTING DEVICE

(71) Applicant: KOREA INSTITUTE OF SCIENCE AND TECHNOLOGY, Seoul (KR)

(72) Inventors: Chong Yun Kang, Seoul (KR); Seok Jin Yoon, Seoul (KR); Young Ho Do, Seoul (KR); Ji Won Choi, Seoul (KR); Hyun Cheol Song, Seoul (KR); Seung Hyub Baek, Seoul (KR); Jin Sang Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 258 days.

(21) Appl. No.: 13/663,781

(22) Filed: Oct. 30, 2012

(65) Prior Publication Data

US 2013/0334930 A1    Dec. 19, 2013

(30) Foreign Application Priority Data

Jun. 13, 2012  (KR) .................. 10-2012-0063206

(51) Int. Cl.
| | | |
|---|---|---|
| *H01L 41/22* | (2013.01) | |
| *H04R 17/00* | (2006.01) | |
| *H01L 41/113* | (2006.01) | |
| *H01L 41/18* | (2006.01) | |
| *H01L 41/312* | (2013.01) | |
| *H01L 41/317* | (2013.01) | |

(52) U.S. Cl.
CPC ............ *H01L 41/113* (2013.01); *H01L 41/183* (2013.01); *H01L 41/312* (2013.01); *H01L 41/317* (2013.01); *Y10T 29/42* (2015.01)

(58) Field of Classification Search
CPC ............ H01L 41/0471; H01L 41/0472; H01L 41/273; Y10T 29/42
USPC ................ 29/25.35, 825, 829, 846, 874, 877; 310/311, 339, 344, 346, 348, 361; 428/195.1, 201, 206, 208
See application file for complete search history.

(56) References Cited

U.S. PATENT DOCUMENTS 8,828,524 B2 *  9/2014  Sakashita ...................... 428/206

FOREIGN PATENT DOCUMENTS

| KR | 10-0838251 B1 | 6/2008 |
|---|---|---|
| KR | 1020100012142 A | 2/2010 |

(Continued)

OTHER PUBLICATIONS

KIPO Office Action dated Jul. 29, 2013; Appln. No. 10-2012-0663206.

(Continued)

*Primary Examiner* — Thiem Phan
(74) *Attorney, Agent, or Firm* — Ladas & Parry LLP

(57) ABSTRACT

Provided are a method of manufacturing a flexible piezoelectric energy harvesting device using a piezoelectric composite, and a flexible piezoelectric energy harvesting device manufactured by the same. The method of manufacturing the flexible piezoelectric energy harvesting device includes: forming a first electrode layer on a first flexible substrate; spin-coating a piezoelectric composite layer on the first electrode layer, wherein the piezoelectric composite layer is produced by mixing piezoelectric powder with polymer; performing heat treatment on the piezoelectric composite layer to harden the piezoelectric composite layer; and bonding a second flexible substrate with a second electrode layer on the hardened piezoelectric composite layer. Therefore, it is possible to simplify a manufacturing process and manufacture a high-performance flexible piezoelectric energy harvesting device having various sizes and patterns.

13 Claims, 2 Drawing Sheets

(56) References Cited

FOREIGN PATENT DOCUMENTS

| KR | 1020110072033 | A | | 6/2011 | |
|---|---|---|---|---|---|
| KR | 1020110094675 | | * | 8/2011 | .............. H01L 41/08 |
| KR | 1020110094675 | A | | 8/2011 | |

OTHER PUBLICATIONS

Jong Hoon Jung, et al; "Lead-Free $NaNbO_3$ Nanowires for a High Output Piezoelectric Nanogenerator", ACSNANO, vol. 5, No. 12, pp. 10041-10046, Published online Nov. 18, 2011.

* cited by examiner

METHOD OF MANUFACTURING FLEXIBLE PIEZOELECTRIC ENERGY HARVESTING DEVICE

CROSS-REFERENCE TO RELATED APPLICATION

This application claims priority to and the benefit of Korean Patent Application No. 2012-0063206, filed on Jun. 13, 2012, the disclosure of which is incorporated herein by reference in its entirety.

BACKGROUND

1. Field of the Invention

The present invention relates to a method of manufacturing a flexible piezoelectric energy harvesting device using a piezoelectric composite and a flexible piezoelectric energy harvesting device manufactured by the same, and more particularly, to a method of manufacturing a flexible piezoelectric energy harvesting device using a piezoelectric composite layer produced by mixing piezoelectric powder with polymer, and a flexible piezoelectric energy harvesting device manufactured by the method.

2. Discussion of Related Art

With the rapid development of electronic technologies in the past decade, device miniaturization and power consumption reduction are being accelerated. In order to develop new power capable of replacing typical discardable batteries, studies into a piezoelectric substance capable of converting mechanical energy, such as pressure, force, vibration, etc., into electrical energy are being actively conducted.

As a result, piezoelectric energy harvesting technology has been developed. Piezoelectric energy harvesting technology is expected to be able to be developed as self power source for USN, a portable device, etc. Also, by manufacturing self power source in the form of a flexible thin film device, diversification and expansion of the self power source are expected. Accordingly, requirement for development of a flexible piezoelectric energy harvesting technology is greatly increasing.

A flexible device is manufactured by preparing an organic substrate such as a polymer substrate since the flexible device requires flexibility, and forming an organic thin film as a thin film configuring a functional part on the organic substrate, or transferring an inorganic thin film on the organic substrate. However, a functional part of an organic thin film cannot ensure high performance due to the properties of an organic thin film, and piezoelectric substances are limited. Also, the technology of transferring an inorganic thin film has problems of making a manufacturing process complicated, not maintaining constant yield, and laying limitations on the selection of inorganic substances usable.

Korean Published Patent No. 2011-0072033 (Applicant: Korea Advanced Institute of Science and Technology, Publishing Date: Jun. 29, 2011) has proposed a method of manufacturing a flexible device by separating an upper device from a silicon substrate in such a manner to etch a metal oxide layer that is easily applied on the silicon substrate. In detail, the Korean Published Patent discloses a method of manufacturing a flexible device, including the steps of: forming a first metal layer on a silicon oxide layer on a silicon substrate; forming a device on the first metal layer; annealing the first metal layer to oxidize the first metal to a first metal oxide; etching the first metal oxide to separate the device from the silicon oxide layer; and transferring the separated device to a flexible substrate using a separate transfer layer.

Also, Korean Published Patent No. 2011-0094675 (Applicant: Kee Sam Jeong, Publishing Date: Aug. 24, 2011) discloses PVDF piezoelectric fabric, and a method of manufacturing a micropower energy harvesting system using the PVDF piezoelectric fabric. In detail, the method of manufacturing the micropower energy harvesting system using the PVDF piezoelectric fabric includes the steps of: electrospinning a conductive polymer material onto a substrate to form a lower electrode layer; electrospinning a piezoelectric polymer material on the lower electrode layer to form a piezoelectric layer; and electrospinning a conductive polymer material on the piezoelectric layer to form an upper electrode layer.

Meanwhile, J. H. Jung et. al. "Lead-Free NaNbO$_3$ Nanowires for High Output Piezoelectric Nanogenerator", ACS Nano, 5, 10041 (2011) has proposed a method of manufacturing a flexible device using a composite produced by mixing NaNbO$_3$ nanowires with polydimethylsiloxane (PDMS). In detail, the method of manufacturing the flexible device includes the steps of: growing an electrode material on a flexible substrate to form an electrode layer; spin-coating a piezoelectric composite produced by mixing NaNbO$_3$ nanowires with PDMS on the electrode layer; performing heat treatment on the piezoelectric composite to harden the piezoelectric composite; attaching the flexible substrate with the electrode layer to the hardened piezoelectric composite to manufacture a flexible piezoelectric energy harvesting device.

A flexible device is manufactured by preparing an organic substrate such as a polymer substrate since the flexible device requires flexibility, and forming a piezoelectric organic thin film on the organic substrate, or transferring an inorganic thin film on the organic substrate. However, a functional part of an organic thin film cannot ensure high performance due to the properties of an organic thin film, and piezoelectric substances are limited. Also, a technology of transferring an inorganic thin film has problems of making a manufacturing process complicated, not maintaining constant yield, and laying limitations on the selection of inorganic substances usable. In addition, in the case of the method of manufacturing the flexible device using the composite produced by mixing NaNbO$_3$ nanowires with PDMS, a manufacturing process of the nanowires is complicated, which makes mass-production difficult.

The present inventors have found that the complexity and limitations of the conventional methods can be overcome when a flexible piezoelectric energy harvesting device is manufactured using a piezoelectric composite layer produced by mixing piezoelectric powder with polymer, so that a highly efficient flexible piezoelectric energy harvesting device having various sizes and patterns can be manufactured through a simple process.

PRIOR ART REFERENCE

Korean Published Patent No. 2011-0072033
Korean Published Patent No. 2011-0094675
J. H. Jung et. al. "Lead-Free NaNbO$_3$ Nanowires for High Output Piezoelectric Nanogenerator", ACS Nano, 5, 10041 (2011)

SUMMARY OF THE INVENTION

The present invention is directed to a method of manufacturing a flexible piezoelectric energy harvesting device using a piezoelectric composite layer produced by mixing piezoelectric powder with polymer.

The present invention is also directed to a flexible piezoelectric energy harvesting device using a piezoelectric composite layer produced by mixing piezoelectric powder with polymer.

According to an aspect of the present invention, there is provided a method of manufacturing a flexible piezoelectric energy harvesting device, including: forming a first electrode layer on a first flexible substrate; spin-coating a piezoelectric composite layer on the first electrode layer, wherein the piezoelectric composite layer is produced by mixing piezoelectric powder with polymer; performing heat treatment on the piezoelectric composite layer to harden the piezoelectric composite layer; and bonding a second flexible substrate with a second electrode layer on the hardened piezoelectric composite layer.

The first flexible substrate and the second flexible substrate may be made of the same material or different materials, and the same material or the different materials may be at least one material selected from a group consisting of polyimide (PI), polyetheretherketone (PEEK), polyethersulfone (PES), polyetherimide (PEI), polycarbonate (PC), polyethylenenaphthalate (PEN), and polyethylene terephthalate (PET).

The first electrode layer and the second electrode layer may be formed of the same material or different materials, and the same material or the different materials may be at least one material selected from a group consisting of platinum (Pt), gold (Au), aluminum (Al), copper (Cu), titanium (Ti), and their alloys, and a group consisting of TiN, WN, $In_2O_3$:Sn (ITO), $SnO_2$:F(FTO), $SrTiO_3$, and $LaNiO_3$.

The piezoelectric powder may be a mixture of at least one material selected from a group consisting of Perovskite materials including lead zirconium titanate (PZT), lanthanum-doped lead zirconate titanate (PLZT), strontium bismuth tantalite (SBT), strontium barium tantalate noibate (SBTN), bismuth titanate (BIT), bismuth lanthanum titanate (BLT), sodium potassium niobate (NKN), sodium niobate (NNO), bismuth titanate (BTO), potassium niobate (KNO), lead magnesium niobate-lead titanate (PMN-PT), lead alumna niobat-lead zirconium titanate doped with $Nb_2O_5$ and $MnO_2$ (PAN-PZT), and lead zinc niobat-lead titanate (PZN-PT), and binary oxides including zinc oxide (ZnO), Magnesium oxide (MgO), and Cadmium oxide (CdO), and the piezoelectric powder may have an average particle diameter that is smaller than 100 nm.

The polymer may be at least one material selected from a group consisting of polydimethylsiloxane (PDMS), polymethylmethacrylate (PMMA), polycarbonate, polycyclic olefine, polyimide, and polyurethane.

A percentage of the piezoelectric powder present in the piezoelectric composite layer produced by mixing the piezoelectric powder with the polymer may be in the range of 1 wt % to 50 wt %.

The piezoelectric composite layer may be formed by a spin-coating method.

The heat treatment may be performed for 10 minutes through 1 hour in an oven at a temperature of 70° C. to 90° C.

According to another aspect of the present invention, there is provided a flexible piezoelectric energy harvesting device manufactured by forming a first electrode layer on a first flexible substrate, spin-coating a piezoelectric composite layer on the first electrode layer, wherein the piezoelectric composite layer is produced by mixing piezoelectric powder with polymer, performing heat treatment on the piezoelectric composite layer to harden the piezoelectric composite layer, and bonding a second flexible substrate with a second electrode layer on the hardened piezoelectric composite layer.

Therefore, by implementing a flexible piezoelectric energy harvesting device using a piezoelectric composite layer produced by mixing piezoelectric powder with polymer, it is possible to simplify a manufacturing process and manufacture a highly efficient flexible piezoelectric energy harvesting device having various sizes and patterns. Also, the flexible piezoelectric energy harvesting device can be formed with various kinds of piezoelectric materials so that a wide range of applications can be expected.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1:
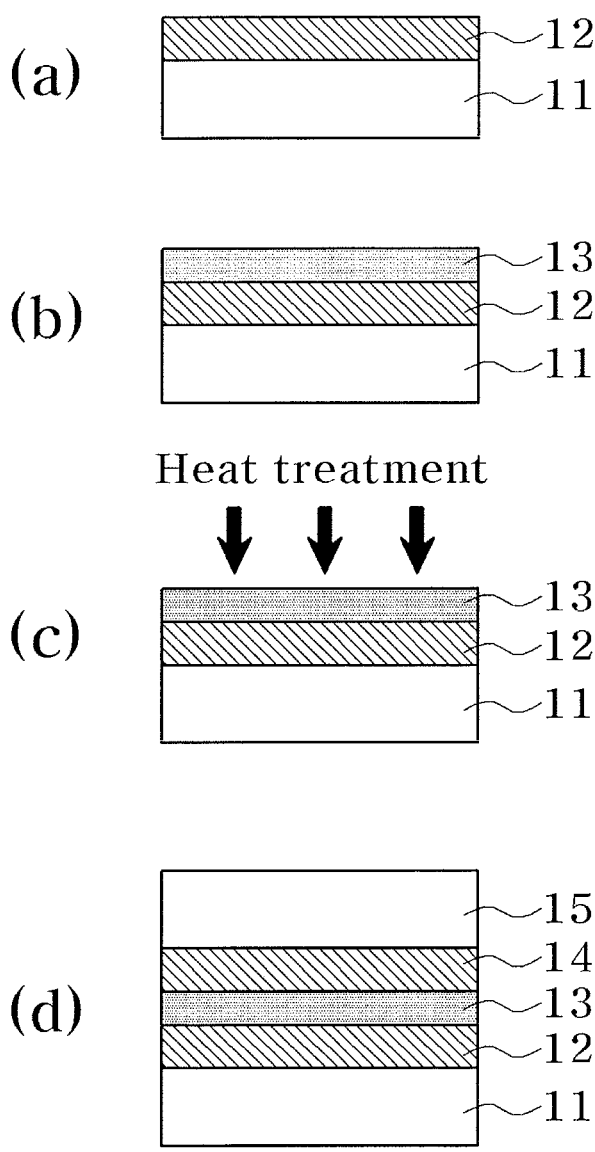
FIG. 1 is a view for explaining a method of manufacturing a flexible piezoelectric energy harvesting device, according to an embodiment of the present invention, wherein (a) is a cross-sectional view of a first flexible substrate with a first electrode layer, (b) is a cross-sectional view of a structure in which a piezoelectric composite layer is formed on the first electrode layer, (c) is a cross-sectional view illustrating a state where heat treatment is performed to harden the piezoelectric composite layer, and (d) is a cross-sectional view of a structure in which a second flexible substrate with a second electrode layer is bonded on the structure of (c)

FIG. 1 is a view for explaining a method of manufacturing a flexible piezoelectric energy harvesting device, according to an embodiment of the present invention.

As shown in (a) of FIG. 1, a first flexible substrate 11 is prepared, and a first electrode layer 12 is formed on the first flexible substrate 11.

The flexible substrate 11 can be understood as a substrate (for example, a plastic substrate, etc.) that is bendable at a predetermined angle, unlike a conventional rigid substrate. The flexible substrate 11 may be made of a material selected from a group consisting of polyimide (PI), polyetheretherketone (PEEK), polyethersulfone (PES), polyetherimide (PEI), polycarbonate (PC), polyethylenenaphthalate (PEN), and polyethylene terephthalate (PET).

The first electrode layer 12 is formed of at least one material selected from a group consisting of platinum (Pt), gold (Au), aluminum (Al), copper (Cu), titanium (Ti), and their alloys, a nitride electrode material including TiN, WN, etc., and an oxide electrode material including $In_2O_3$:Sn(ITO), $SnO_2$:F(FTO), $SrTiO_3$, $LaNiO_3$, etc.

The first electrode layer 12 may be formed using one of various deposition processes, and the deposition processes includes physical vapor deposition (PVD), chemical vapor deposition (CVD), sputtering, pulsed laser deposition (PLD), thermal evaporation, electron beam evaporation, atomic layer deposition (ALD), and molecular beam epitaxy (MBE). The first electrode layer 12 may be formed to a thickness that is generally used in the related technical art. For example, the first electrode layer 12 may be formed to an arbitrary thickness in the range of 50 nm to 200 nm.

Then, as shown in (b) of FIG. 1, a piezoelectric composite layer 13 produced by mixing piezoelectric powder with polymer is formed on the first electrode layer 12.

The piezoelectric powder may be made of at least one material selected from a group having piezoelectric properties, the group consisting of Perovskite materials including PZT (lead zirconium titanate: $Pb(Zr_xTi_{1-x})O_3$, $0<x<1$), PLZT (lanthanum-doped lead zirconate titanate: $PbyLa1-y(ZrxTi1-x)O_3$, $0<x<1$, $0<y<0.5$), SBT (strontium bismuth tantalite: $SrBi_2Ta_2O_9$), SBTN (strontium barium tantalate noibate), BIT (bismuth titanate $Bi_4Ti_3O_{12}$), BLT (bismuth lanthanum titanate: $Bi_4-xLaxTi_3O_{12}$, $0<x<0.5$), NKN (sodium potassium niobate: $(K, Na)NbO_3$), NNO (sodium niobate: $NaNbO_3$), BTO (bismuth titanate: $Bi_4Ti_3O_{12}$), KNO (potassium niobate, $KNbO_3$), PMN-PT (lead magnesium niobate-lead titanate), PAN-PZT (lead alumna niobat-lead zirconium titanate doped with $Nb_2O_5$ and $MnO_2$), and PZN-PT (lead zinc niobat-lead titanate), etc., or binary oxides including ZnO (Zinc oxide), MgO (Magnesium oxide), and CdO (Cadmium oxide). Preferably, the piezoelectric powder may include PZT or ZnO.

The piezoelectric powder can be easily synthesized, and the particle sizes of the piezoelectric powder can be easily adjusted. The piezoelectric powder has an average particle diameter below 100 nm, preferably below 50 nm, specifically preferably between 1 nm and 40 nm, and more preferably between 5 nm and 30 nm. It is difficult to manufacture piezoelectric power, the particle size of which is smaller than 1 nm, and if the particle size of piezoelectric powder is larger than 100 nm, the piezoelectric powder cannot be uniformly distributed upon formation of piezoelectric polymer.

The polymer may be a material selected from a group consisting of polydimethylsiloxane (PDMS), polymethylmethacrylate (PMMA), polycarbonate, polycyclic olefine, polyimide, and polyurethane. Preferably, the polymer may be PDMS.

The percentage of the piezoelectric powder present in the piezoelectric composite layer 13 produced by mixing the piezoelectric powder with the polymer may be selected in the range of 1 wt % to 50 wt %, preferably, in the range of 5 to 15 wt %. If 1 wt % or less of piezoelectric powder is contained, the piezoelectric polymer will fail to produce a sufficient piezoelectric effect, whereas if 50 wt % or more of piezoelectric powder is contained, the flexibility of the piezoelectric polymer will deteriorate.

As described above, the piezoelectric composite layer 13 produced by mixing the piezoelectric powder with the polymer is formed on the first electrode layer 12. The piezoelectric composite layer 13 may be formed preferably using a spin-coating method. It is preferable that the mixture of the piezoelectric powder and the polymer are made of only two kinds of materials thereof in order to prevent resistance and piezoelectric properties of the composite from deteriorating due to addition of other materials. The piezoelectric composite layer 13 may be formed, preferably, to a thickness in the range of 1 μm to 500 μm.

Successively, as shown in (c) of FIG. 1, heat treatment is performed on the piezoelectric composite layer 13 to harden the piezoelectric composite layer 13. A method of hardening the piezoelectric composite layer 13 may depend on the kind of polymer. Generally, the heat treatment is performed for 10 minutes through 1 hour in an oven at a temperature of 70 through 90° C. If heat treatment conditions are deviated from the lower limits of the time and temperature conditions, the piezoelectric composite layer 13 will be not hardened, which will make the following processes difficult, whereas if heat treatment conditions are deviated from the upper limits of the time and temperature conditions, the flexibility of the piezoelectric composite layer 13 will deteriorate.

Then, as shown in (d) of FIG. 1, a second flexible substrate 15 with a second electrode layer 14 is bonded on the hardened piezoelectric composite layer 13 to manufacture a flexible piezoelectric energy harvesting device.

A method of bonding the second flexible substrate 15 requires no adhesive material since the piezoelectric composite layer 13 itself is hardened in the state of having an appropriate degree of adhesiveness. However, for device stability, a polymer-based tape or a polymer-based hardener can be used.

The second electrode layer 14 may be formed of the same material as or a different material from the first electrode layer 12. Likewise, the second electrode layer 14 may be formed of at least one material selected from a group consisting of platinum (Pt), gold (Au), aluminum (Al), copper (Cu), titanium (Ti), and their alloys, a nitride electrode material including TiN, WN, etc., and an oxide electrode material including $In_2O_3$:Sn(ITO), $SnO_2$:F(FTO), $SrTiO_3$, $LaNiO_3$, etc.

The second electrode layer 14 may be formed by a deposition method among physical vapor deposition (PVD), chemical vapor deposition (CVD), sputtering, pulsed laser deposition (PLD), thermal evaporation, electron beam evaporation, atomic layer deposition (ALD), and molecular beam epitaxy (MBE). The second electrode layer 14 may be formed to a thickness that is generally used in the related technical art. For example, the second electrode layer 14 may be formed to an arbitrary thickness in the range of 50 nm to 200 nm.

The second flexible substrate 15 may be made of the same material as or a different material from the first flexible substrate 11. For example, the second flexible substrate 15 may be made of a material selected from a group consisting of polyimide (PI), polyetheretherketone (PEEK), polyethersulfone (PES), polyetherimide (PEI), polycarbonate (PC), polyethylenenaphthalate (PEN), and polyethylene terephthalate (PET).

The first electrode layer 12 may be an upper electrode layer, and the second electrode layer 14 may be a lower electrode layer. However, the first electrode layer 12 may be a lower electrode layer, and the second electrode layer 14 may be an upper electrode layer.

The flexible piezoelectric energy harvesting device may be manufactured as various types of devices according to the kinds of piezoelectric composites used.

Hereinafter, an example of the present invention will be described in detail, however, the present invention is not limited to the example that will be described below.

Example

Figure 2:
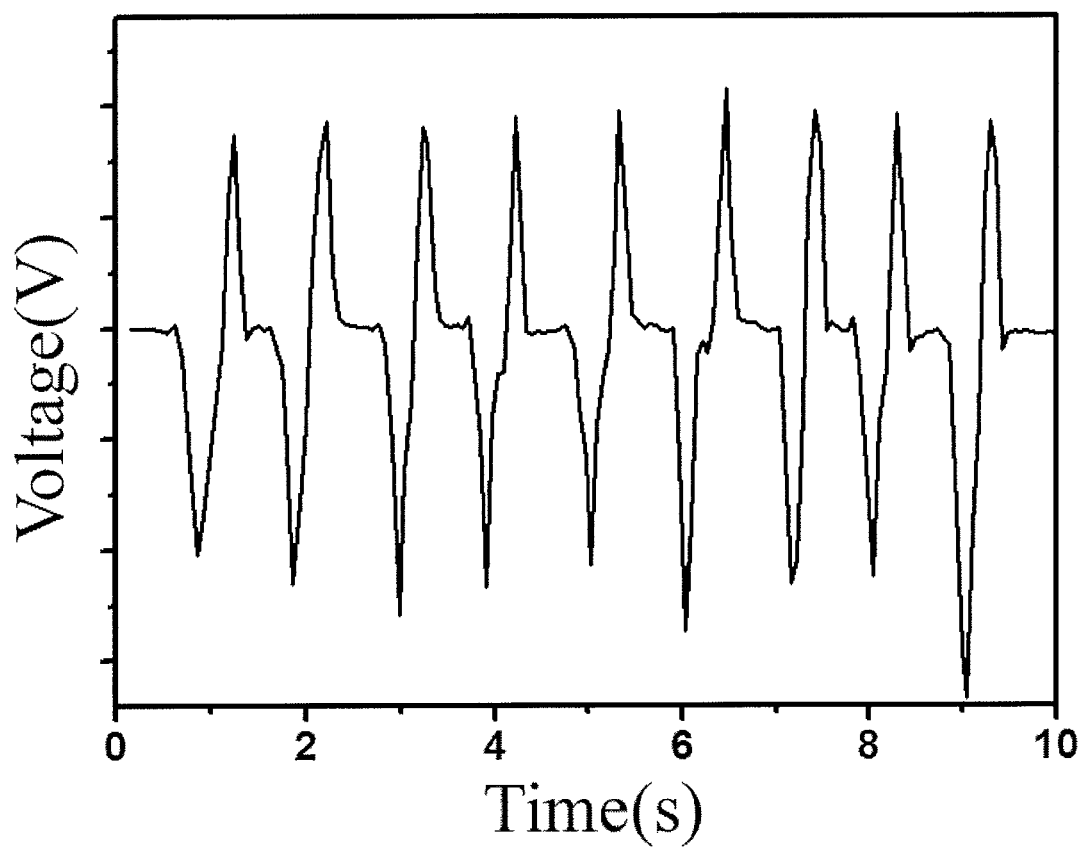
FIG. 2 is a graph showing the output voltage of a flexible piezoelectric energy harvesting device according to an embodiment of the present invention.

A Pt electrode layer was formed on a polyimide-based flexible substrate. The Pt electrode layer was formed at room temperature to a thickness of 100 nm using a PVD method. Successively, a mixture produced by mixing 1 g of PZT with 12 g of PDMS was deposited to a thickness of 10 μm on the Pt electrode layer by a spin-coating method to thereby form a piezoelectric composite layer, wherein the average particle diameter of the PZT was 20 nm. Thereafter, heat treatment was performed for 12 minutes in an oven at 80° C. to harden the piezoelectric composite layer. Then, a polyimide-based flexible substrate with a Pt electrode layer was bonded on the piezoelectric composite layer to thereby manufacture a flexible piezoelectric energy harvesting device. The Pt electrode layer on the polyimide-based flexible substrate was formed to a thickness of 100 nm at room temperature by a PVD method. The results of measurement on the output voltage of the flexible piezoelectric energy harvesting device when pressure is applied to the device are shown in FIG. 2.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of manufacturing a flexible piezoelectric energy harvesting device, comprising the steps of:
   forming a first electrode layer on a first flexible substrate;
   spin-coating a piezoelectric composite layer on the first electrode layer, wherein the piezoelectric composite layer is produced by mixing piezoelectric powder with polymer;
   performing heat treatment on the piezoelectric composite layer to harden the piezoelectric composite layer; and
   bonding a second flexible substrate with a second electrode layer on the hardened piezoelectric composite layer, wherein the heat treatment comprises heating the piezoelectric composite layer at a temperature and time (a) effective to harden the piezoelectric composite layer to a state in which the piezoelectric composite layer has sufficient adhesiveness to adhere to the second flexible substrate in said bonding step without an adhesive material, and (b) that does not deteriorate a flexibility of the piezoelectric composite layer.

2. The method of claim 1, wherein the first flexible substrate and the second flexible substrate are made of the same material or different material, and the same material or the different materials are at least one material selected from a group consisting of polyimide (PI), polyetheretherketone (PEEK), polyethersulfone (PES), polyetherimide (PEI), polycarbonate (PC), polyethylenenaphthalate (PEN), and polyethylene terephthalate (PET).

3. The method of claim 1, wherein the first electrode layer and the second electrode layer are formed of the same material or different material, and the same material or the different materials are at least one material selected from a group consisting of platinum (Pt), gold (Au), aluminum (Al), copper (Cu), titanium (Ti), and their alloys, and a group consisting of TiN, WN, $In_2O_3$:Sn(ITO), $SnO_2$:F(FTO), $SrTiO_3$, and $LaNiO_3$.

4. The method of claim 1, wherein the piezoelectric powder are a mixture of at least one material selected from a group consisting of Perovskite materials including lead zirconium titanate (PZT), lanthanum-doped lead zirconate titanate (PLZT), strontium bismuth tantalite (SBT), strontium barium tantalate noibate (SBTN), bismuth titanate (BIT), bismuth lanthanum titanate (BLT), sodium potassium niobate (NKN), sodium niobate (NNO), bismuth titanate (BTO), potassium niobate (KNO), lead magnesium niobate-lead titanate (PMN-PT), lead alumna niobat-lead zirconium titanate doped with $Nb_2O_5$ and $MnO_2$ (PAN-PZT), and lead zinc niobat-lead titanate (PZN-PT), and binary oxides including zinc oxide (ZnO), Magnesium oxide (MgO), and Cadmium oxide (CdO).

5. The method of claim 4, wherein the piezoelectric powder comprises lead zirconium titanate (PZT).

6. The method of claim 1, wherein the piezoelectric powder has an average particle diameter that is smaller than 100 nm.

7. The method of claim 1, wherein the polymer is at least one material selected from a group consisting of polydimethylsiloxane (PDMS), polymethylmethacrylate (PMMA), polycarbonate, polycyclic olefine, polyimide, and polyurethane.

8. The method of claim 1, wherein the percentage of the piezoelectric powder present in the piezoelectric composite layer produced by mixing the piezoelectric powder with the polymer is in the range of 1 wt % to 50 wt %.

9. The method of claim 1, wherein the piezoelectric composite layer is formed by a spin-coating method.

10. The method of claim 1, wherein the heat treatment is performed for 10 minutes through 1 hour in an oven at a temperature of 70° C. to 90° C.

11. The method of claim 1, wherein the bonding step comprises adhering the piezoelectric composite layer to the second flexible layer with a polymer-based tape or a polymer-based hardener to enhance stability of the flexible piezoelectric energy harvesting device.

12. The method of claim 1, wherein the bonding step comprises adhering the piezoelectric composite layer to the second flexible layer without an adhesive material.

13. The method of claim 1, wherein the piezoelectric composite layer consists of the piezoelectric powder and the polymer, and wherein the piezoelectric powder has an average particle diameter that is smaller than 100 nm.

* * * * *